United States Patent [19]

Epstein

[11] 4,127,888
[45] Nov. 28, 1978

[54] SURGE PROTECTOR AND TEST NETWORK FOR AC EQUIPMENT

[76] Inventor: Barry M. Epstein, 7523 Cliffbrook, Dallas, Tex. 75240

[21] Appl. No.: 825,825

[22] Filed: Aug. 18, 1977

[51] Int. Cl.$^2$ .............................................. H02H 3/22
[52] U.S. Cl. ........................................ 361/91; 324/51; 324/107; 324/158 D; 361/111
[58] Field of Search ................. 361/91, 56, 88, 1, 111, 361/110; 324/107, 86, 110, 102, 72, 73 R, 133, 132, 51, 158 D; 340/253 E

[56] References Cited

U.S. PATENT DOCUMENTS

| | | | |
|---|---|---|---|
| 3,546,572 | 12/1970 | Specht et al. | 361/56 X |
| 3,778,713 | 12/1973 | Jamison | 324/158 D |
| 4,023,101 | 5/1977 | Christoffer | 324/86 X |

Primary Examiner—Patrick R. Salce
Attorney, Agent, or Firm—Kenneth R. Glaser

[57] ABSTRACT

Disclosed is combination surge voltage protective and test apparatus for an AC supply system, the apparatus including a plurality of surge voltage protectors switchably connected with the supply lines and an interconnected test network operable to test the status of the supply voltages when the switch is closed and to test the status of the surge voltage protectors when the switch is open. The apparatus is disposed with an enclosure having a door which, when closed, closes the switch and prevents application of power to the test network, while otherwise allowing access to operation of the test network.

8 Claims, 4 Drawing Figures

SURGE PROTECTOR AND TEST NETWORK FOR AC EQUIPMENT

This invention relates to protective apparatus for AC equipment, more particularly to surge voltage protection, and even more particularly to combination surge protector and test networks.

There are many applications where it is necessary to protect AC load equipment from power surges which could deleteriously affect and damage such equipment. In particular, modern day data processing equipment include highly sensitive electronic components which are particularly susceptible to damage due to power spikes which may occur as a result of transients in the feeder lines or the load itself, or as a consequence of external causes such as lightning or corona discharges.

Numerous protective networks have been designed in an attempt to protect the load equipment from these power surges; but existing networks have not been entirely satisfactory for all conditions of service. Specifically, it would be desirable that such protective networks be adapted for convenient installation with existing equipment and which are also adapted for convenient testing of the protective network as well as the overall system.

It is therefore a principal object of the present invention to provide improved surge voltage protection for AC load equipment, and particularly for data processing equipment.

It is another object of the present invention to provide new and improved surge voltage protection apparatus which can be conveniently connected with existing installations and which enable full testing of the protective apparatus as well as the total system.

It is an even further object of the present invention to provide a test network associated with the surge voltage protective network, which test network can effectively provide total testing of the entire system without interruption of power, or itself causing power surges, to the load.

In accordance with these and other objects, the present invention is directed to a combination surge voltage protector and test network adapted for shunt connection across the three phase supply lines and neutral supplying AC power to the load. The protector network portion includes one or more surge voltage suppressors connected between each phase conductor and the neutral return, the test network portion interconnected with the protector network and enabling full testing of the conditions of the supply lines, protector network, and test network itself. A main switch actuated and deactuated by the closing and opening of the door to the enclosure in which the network is contained facilitates testing without interruption of the power to the load.

For a more complete understanding of the invention, and for further objects, advantages and features thereof, reference may now be had to the following detailed description taken in conjunction with the accompanying drawings, in which.

Figure 1:
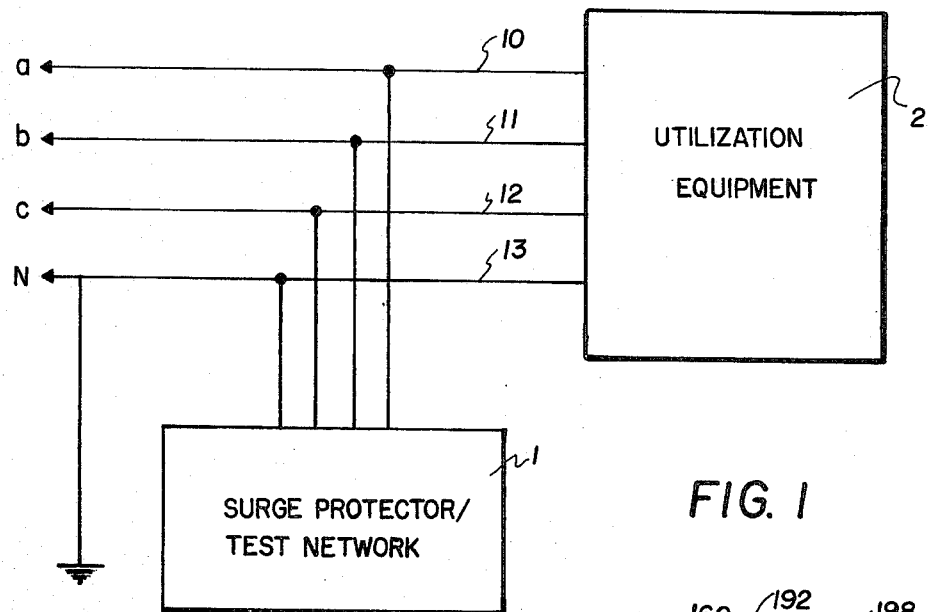
FIG. 1 is a block diagram illustrating the interconnection of the surge protector/test network of the present invention with the equipment being protected.

Referring initially to FIG. 1, the surge protector/test network 1 of the present invention is connected across the three phase supply lines 10–12 (and neutral line 13) which supply the requisite AC power to the utilization equipment 2 being protected by the surge protector portion of the network 1. While the equipment 2 may be of any type which requires protection from power spikes caused, for example, by transients from the feeder station, lightning or related corona discharges, or surges occuring within the equipment 2 itself; the network 1 of the present invention has particular applicability where the equipment 2 is data processing apparatus which is particularly susceptible to such power surges.

The network 1 is shunted across the power lines 10–13 immediately adjacent the equipment 2 being protected and preferably intermediate the equipment and the distribution transformer (not shown) supplying power thereto. Thus, and as will become apparent from the following description, the network 1 can be easily connected with, and protect, existing installations, as well as perform the desired testing without the need of interrupting the power to the equipment 2. As subsequently described in greater detail, the entire network 1 can be easily plugged in or installed at the circuit breaker box, the common power point for the equipment 2, thus protecting all of the components and circuits of that equipment.

Figure 2:
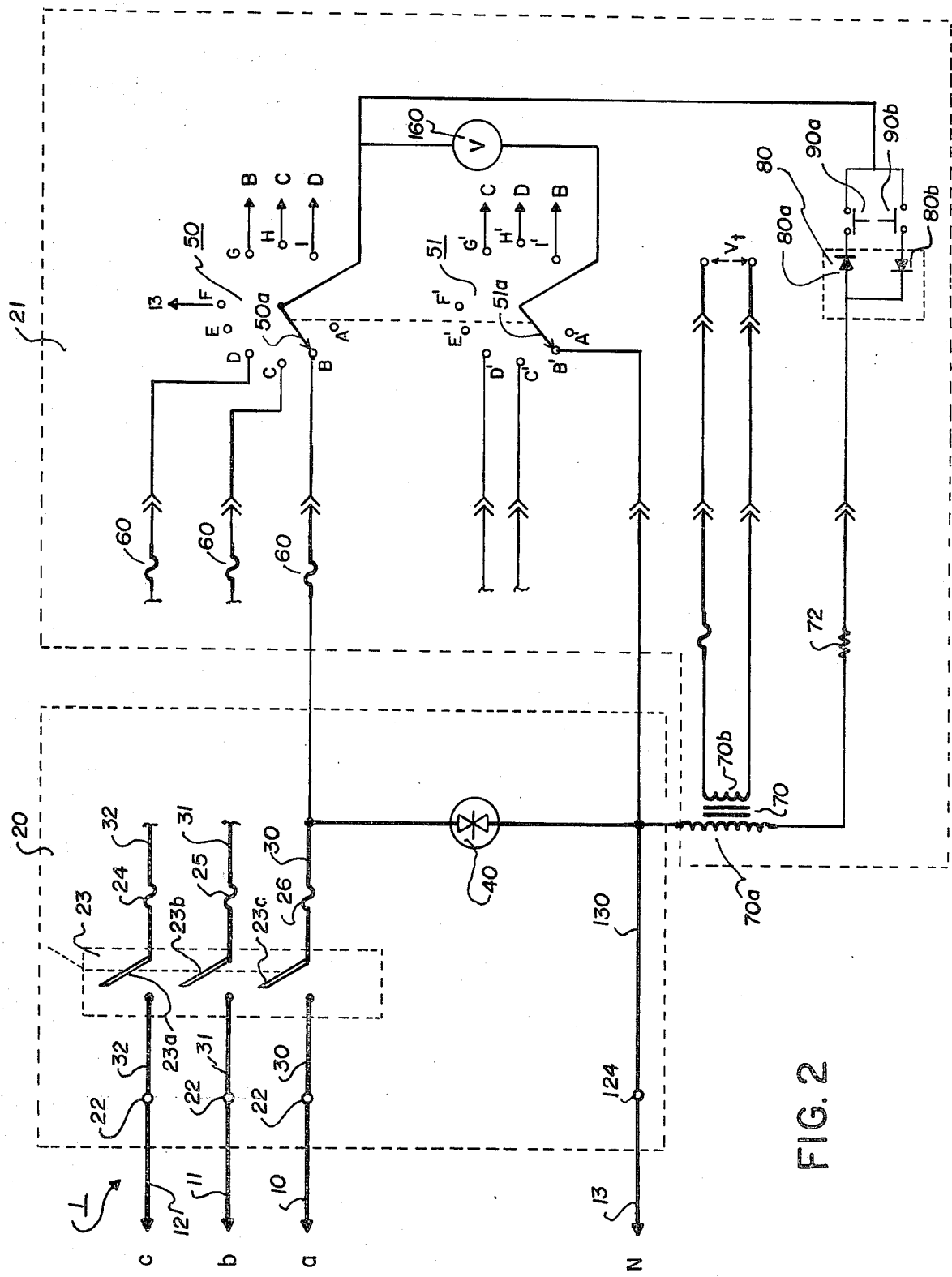
FIG. 2 is a detailed circuit schematic of a preferred embodiment of the surge protector/test network of the present invention.

Referring now to FIG. 2, the details and operation of the surge protector/test network 1 are now described. Accordingly, the network 1 comprises a first protector network portion 20 which is effective to protect the utilization equipment 2 from undesirable power surges and a second interconnected test network portion 21 which is effective, without power interruption, to test (1) the status of power being supplied to the utilization equipment, (2) the protector network portion 20, and (3) to self test the network 21.

The network 20 includes heavy duty conductors 30, 31, and 32 respectively connected by way of connectors 22 to the three phase supply lines 10, 11, and 12. A heavy duty switch 23 (having individual switch portions 23a, 23b, and 23c in series with heavy duty time delay fuses 24, 25 and 26) is connected intermediate the respective portions of the conductors 30, 31 and 32. To implement the unique testing subsequently described, the switch 23 (and particularly the mechanically ganged portions 23a, 23b, and 23c) is "opened" and "closed" in response to the opening and closing of the door to the enclosure housing the network 1.

Connected between the switch portion associated with each phase conductor and the neutral line 13 are respective heavy duty surge voltage suppressors which, upon the occurrence of a voltage surge in the particular phase, are effective to shunt the excessive current resulting therefrom to ground, thus protecting the circuit components and networks of the equipment 2. For convenience of description, FIG. 2 illustrates only one such voltage suppressor 40 connected to conductor 30 effective to protect against power surges in one phase (phase a), it being understood that similar suppressors would be respectively interconnected with conductors 31 and 32 to provide protection for power surges in phases b and c. Accordingly, surge voltage suppressor 40 is interconnected (by conductor 130) to the neutral line 13 by way of heavy duty connector 124, as depicted in FIG. 2.

The suppressor 40 is not unique in of itself and can be any one of a number of devices which are effectively open-circuited when voltages up to a predetermined minimum appear across its terminals and which will exhibit a limited degree of conduction when the voltage across such terminals exceeds such predetermined minimum. Thus, when switch 23 is closed, and when normal supply voltages are present in each of the phases, no or very little current flows through the suppressors 40 and the power is supplied to the equipment 2. Upon the occurrence of an excessive voltage surge in phase a for example, the effective resistance of the suppressor 40 is reduced, thus shunting the resulting excessive current in supply line 10 to ground, and maintaining the operating voltage essentially at its normal operating value. Since voltage suppressors are interconnected with each of the three phase supply lines, the equipment 2 is thus protected from these transient voltage surges.

In accordance with a unique feature of the present invention, and due to the shunt connection of the protector network portion 20, it is possible to conveniently interconnect a test network portion 21 to perform complete testing, as subsequently described, without the necessity of interrupting the power to the equipment 2. Accordingly, a test network portion 21 comprises wafer type switches 50 and 51 with respective switch contacts 50a and 51a ganged to simultaneously contact terminals A-I of switch 50 and corresponding terminals A'-I' of switch 51.

Terminals B, C, and D of switch 50 are respectively connected (by way of time delay fuses 60) to each one of the conductors 30-32 at one end of the surge voltage suppressor (the connection of terminal B to one end of the suppressor 40 being depicted in FIG. 2). Terminals B'-D' of switch 51, on the other hand, are respectively connected to the other side of the suppressors for each phase (as indicated by the connection in FIG. 2 of terminal B' to the other end of voltage suppressor 40). Terminals G, H, and I of switch 50 are respectively connected with the supply lines 10, 11 and 12 (phases a, b, and c); while the terminals G', H', and I' of switch 51 are respectively connected with supply lines 11, 12, and 10. Thus, this switch connection just described provides phase-to-phase measurements, it being understood that phase-to-neutral measurements can also be effected by appropriate changes to such switch connection. A voltmeter 160 is connected between the switch contacts 50a and 51a.

A transformer 70 has its high voltage winding 70a connected intermediate one end of the surge voltage suppressors 40 and a diode network 80 (by way of current limiting resistor 72). $V_T$ supplies power to the low voltage winding 70b. A pair of momentary contacts 90a and 90b, when depressed, respectively interconnect the transformer winding 70a with either the diode 80a or reverse-biased diode 80b with the high side of the voltmeter 160.

As a consequence of the aforementioned construction of the network portion 21, and its interconnection with protector network 20, a full range of testing may be accomplished without interruption of power to the equipment 2. For example, when the switch 23 is closed, and the switch contacts 50a and 51a rotated to the terminal positions G—G', H—H', or I—I' the test network 21 monitors the voltages to $V_{ab}$, $V_{bc}$, or $V_{ca}$ respectively.

On the other hand, when switch 23 is open, the switch contact 50a and 51a may be correspondingly rotated to terminals B—B', C—C', or D—D' (for surge voltage testing of phases a, b, or c), with depression of momentary switch 90a allowing for testing of positive surges and depression of momentary switch 90b allowing for testing of negative surges, the requisite power for such surge testing being furnished at the output of the transformer 70. Rotation of the switch contacts 50a and 51a to the positions E—E' and F—F' respectively provide open circuit testing of the surge voltage suppressors 40 and short circuit testing of the test circuit 21 itself. As may be apparent, positioning of the switch contacts 50a and 51a to the terminals A—A' positions the switches in the "off" position.

Figure 3:
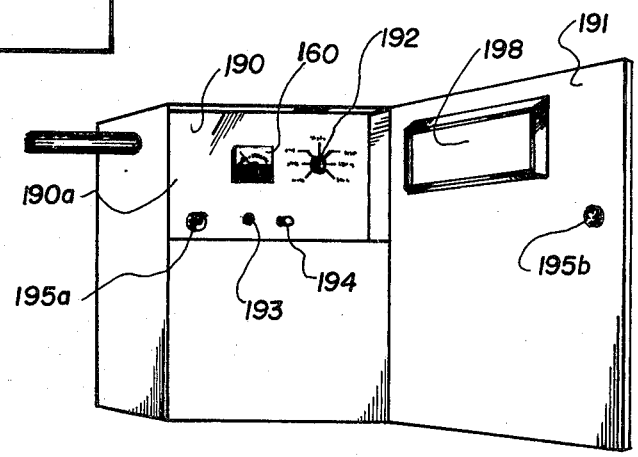
FIG. 3 is an illustration of the housing enclosing the network depicted in FIG. 2.

Referring now to FIG. 3, the housing 190 in which the surge protector/test network 1 is depicted. Accordingly, the front panel 190a has a cut-out portion through which the face of the voltmeter 160 extends, a knob 192 being provided for simultaneously rotating the switch contacts 50a and 51a to the respective "test" positions as previously described. A plug 193 and spring loaded toggle 194 respectively provide the power to the transformer 70 and operate the momentary contacts 90a and 90b in the manner previously described.

Figure 4:
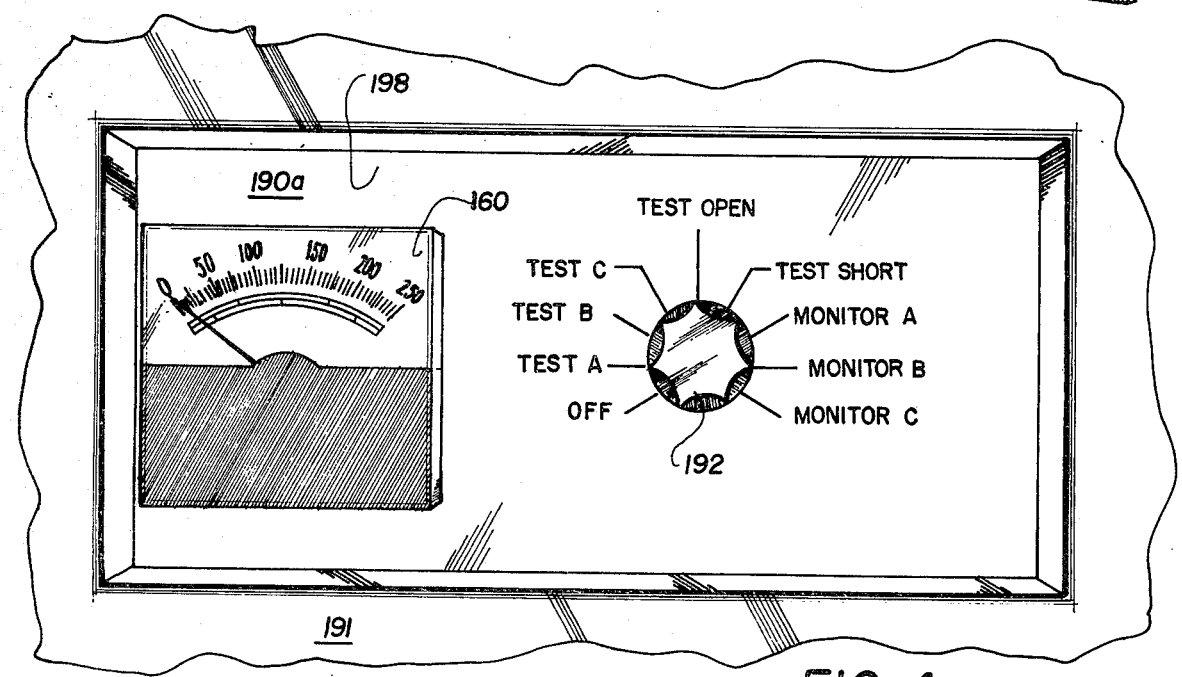
FIG. 4 is an illustration of a portion of the housing depicted in FIG. 3, showing the door to such housing in its closed position.

A door 191 hingedly mounted to housing 190 has a flanged opening 198 so positioned therein that when the door 191 is closed (FIG. 4), the plug 193 and toggle 194 are rendered inaccessible while the face of the meter 160 and knob 192 can be respectively viewed and operated through the port 198. In addition, and significant to the operation of the present invention, mating members 195a and 195b provide an interlock mechanism which, when the door 191 is shut, closes switch 23 (FIG. 2).

Various modifications to, and additions and substitutions for, the disclosed embodiment of the invention may be effected. For example, rather than utilizing one surge voltage suppressor per phase, a pair of surge voltage suppressors may be utilized, one on the line side and the other on the load side. Furthermore, it is understood that the suppressors can be respectively interconnected between the three phase supply lines as well as between neutral and ground. Additionally, means may be associated with each of the surge voltage suppressors 40 for indicating and counting the quantity and frequency of power surges in each of the phases.

Various other modifications to the disclosed embodiment, as well as alternate embodiments, of the present invention may become apparent to one skilled in the art without departing from the scope and spirit of the invention as defined by the appended claims.

What is claimed is:

1. In a system for supplying three phase power from a voltage source to a load, surge voltage protection apparatus comprising:
    (a) a plurality of surge voltage suppressors respectively connected to the three phase supply lines by way of first switching means adapted to switchably connect and disconnect, said voltage suppressors with said voltage source, and
    (b) test network means interconnected with, and across, said plurality of surge voltage suppressors for monitoring the status of voltages in each of the three phases and for testing the status of the surge voltage suppressors, (c) said first switching means, when closed, enabling said test network means to monitor said three phase voltages and, when open, enabling said test network means to test the status of said surge voltage suppressors.

2. The system as defined by claim 1 wherein said test network means includes power supply means for independently furnishing power to each of said surge voltage suppressors.

3. The system as defined by claim 2 wherein said test network means comprises second switching means switched between a first state enabling the monitoring of the status of voltages in each of the three phases and a second state enabling testing of the status of the surge voltage suppressors; and wherein said test network means further comprises a meter electrically connected with the said second switching means.

4. The system as defined by claim 3 wherein said surge voltage protection apparatus is housed within an enclosure having a door operable between an open and closed condition, the door when in its closed position closing said first switching means and when in its open position opening said first switching means.

5. The system as defined by claim 4 wherein means are associated with said door to allow access to said meter and second switching means, and prevent access to said power supply means, when said door is in its closed condition.

6. Combination surge voltage protection and test apparatus, comprising:
 (a) an enclosure having a door swingably mounted thereto between an open and closed position, said door having a limited access opening therein,
 (b) a first surge voltage network comprising a plurality of surge voltage suppressors adapted to be connected with a three phase voltage source by way of first switching means,
 (c) a second test network interconnected with said first network for monitoring the status of said three phase voltage source and for testing the status of said surge voltage suppressors,
 (d) said first and second networks disposed within said enclosure, and
 (e) means associated with said door for closing said first switching means when said door is in its closed position and opening said first switching means when said door is in its open position.

7. The apparatus as defined by claim 6 wherein said second test network includes power supply means for independently furnishing power to each of said surge voltage suppressors.

8. The apparatus as defined by claim 7 wherein means is associated with said door for preventing access to said power supply means when said door is closed.

* * * * *